(12) United States Patent
Kawashima (10) Patent No.: US 6,617,218 B2
(45) Date of Patent: Sep. 9, 2003

(54) MANUFACTURING METHOD FOR SEMICONDUCTOR DEVICE

(75) Inventor: Hiroshi Kawashima, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/192,552

(22) Filed: Jul. 11, 2002

(65) Prior Publication Data

US 2003/0100161 A1 May 29, 2003

(30) Foreign Application Priority Data

Nov. 26, 2001 (JP) ........................... 2001-359026

(51) Int. Cl.[7] ............................................. H01L 21/336
(52) U.S. Cl. ........................ 438/301; 438/302; 438/294
(58) Field of Search ................................. 438/301, 302, 438/294, 202, 618, 329

(56) References Cited

U.S. PATENT DOCUMENTS

| | | | | |
|---|---|---|---|---|
| 5,888,861 A | * | 3/1999 | Chien et al. | 438/202 |
| 5,994,720 A | * | 11/1999 | Snyman et al. | 257/86 |
| 6,111,271 A | * | 8/2000 | Snyman et al. | 257/80 |
| 6,159,839 A | * | 12/2000 | Jeng et al. | 438/618 |
| 6,187,646 B1 | * | 2/2001 | Gris | 438/329 |
| 6,297,111 B1 | * | 10/2001 | Krivokapic | 438/302 |
| 6,376,883 B1 | * | 4/2002 | Gris | 438/202 |
| 6,501,139 B1 | * | 12/2002 | Petti | 438/294 |

FOREIGN PATENT DOCUMENTS

JP          9-213809          8/1997

* cited by examiner

*Primary Examiner*—John F. Niebling
*Assistant Examiner*—Walter L. Lindsay, Jr.
(74) *Attorney, Agent, or Firm*—McDermott, Will & Emery (57) ABSTRACT

A region around the gate of a PMOSFET that does not, at a minimum, affect the transistor characteristics is covered with a resist and a diagonal ion implantation for drain engineering is carried out in a P well region beneath gate electrode. Ions of a first conductive type are implanted in a portion wherein a well contact layer is formed so as to form well contact layer. The above described diagonal ion implantation and the ion implantation for forming the above described well contact layer are carried out so that when the depth is plotted along the longitudinal axis and the impurity concentration is plotted along the lateral axis in the impurity profile of well contact larger, impurity profile or the first conductive type that forms well contact layer covers profile of the impurities that form the impurity diffusion layer.

4 Claims, 8 Drawing Sheets

MANUFACTURING METHOD FOR SEMICONDUCTOR DEVICE

BACKGROUND OF THE INVENTION

1. Field of the Invention

The present invention relates to a manufacturing method for a semiconductor device that is improved so that the negative effects of shadowing of a resist due to miniaturization can be prevented at the time of diagonal ion implantation.

2. Description of the Background Art

Figure 7:
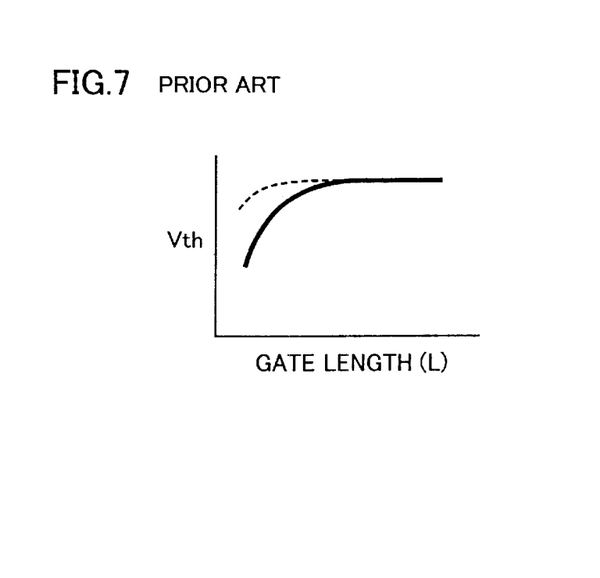
FIG. 7 is a graph for describing a short channel effect.

As miniaturization progresses, short channel effects, and the like, occurs in transistor characteristics so that the requirements for overcoming this become stringent. Short channel effects refers to the phenomenon wherein the threshold voltage falls as the gate length is shortened in reference to the curve shown by the solid line in FIG. 7. When the threshold voltage falls it becomes difficult to control the transistor and, therefore, it becomes necessary to raise the threshold voltage according to the curve shown by the dotted line in the figure. As a technology for achieving this purpose, a drain engineering technology using a diagonal ion implantation such as the below described SPI (shallow pocket implant) structure, or the like, has increased in importance.

Figure 8A:
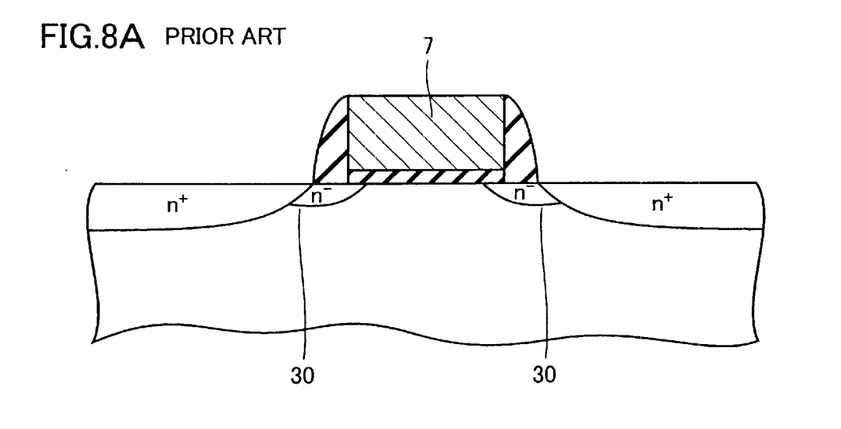
FIG. 8A is a cross sectional view of a transistor that has an LDD structure.

The technology using the diagonal ion implantation is also used for formation of an LDD (lightly doped drain) structure wherein an electrical field relaxation is carried out on a transistor. FIG. 8A shows an example wherein extension parts 30 of an LDD structure are formed using diagonal ion implantation technology.

Figure 8B:
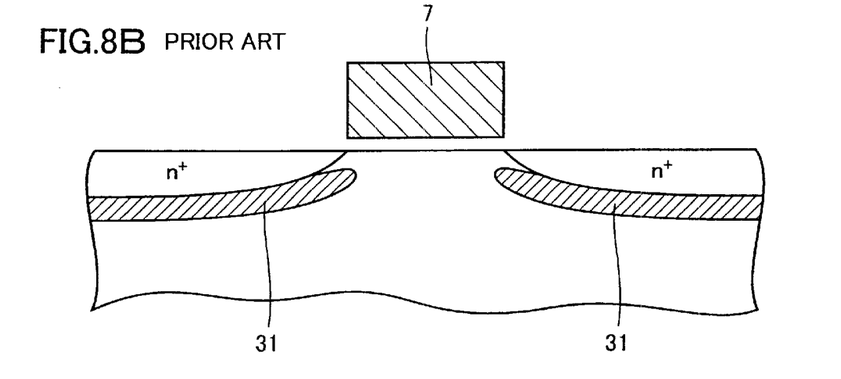
FIG. 8B is a cross sectional view of a transistor in which a punch through stopper layer is formed.

FIG. 8B shows an example wherein a transistor of an SPI (shallow pocket implant) structure, or the like, is formed using diagonal ion implantation technology in order to suppress the above described short channel effect. The SPI structure is implemented by forming a punch through stopper layer 31 of the conductive type opposite to that of the source/drain regions beneath the source/drain regions.

In the present specification, drain engineering means to improve the structure of a drain of a transistor and, more concretely, is defined as adjusting the impurity profile in an LDD or in an SPI.

A technology that makes full use of diagonal ion implantation is widely utilized in drain engineering for transistors.

In a diagonal ion implantation technology, however, a (shadowing) region of no implantation occurs at a resist mask edge portion due to shadow formation. Accordingly, as miniaturization progresses this shadow region becomes an obstacle against miniaturization. In addition, the effects of this shadowing on the device become greater as miniaturization progresses to the extent that they can not be ignored.

This is described further in detail.

Figure 9:
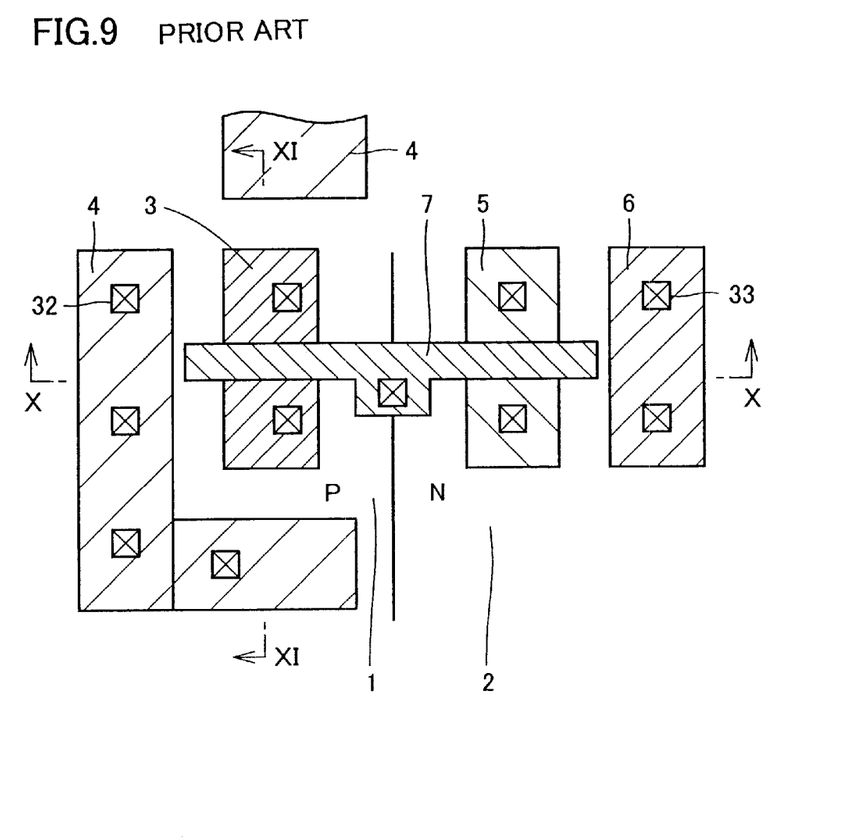
FIG. 9 is a plan view of a semiconductor device according to a prior art.
Figure 10:
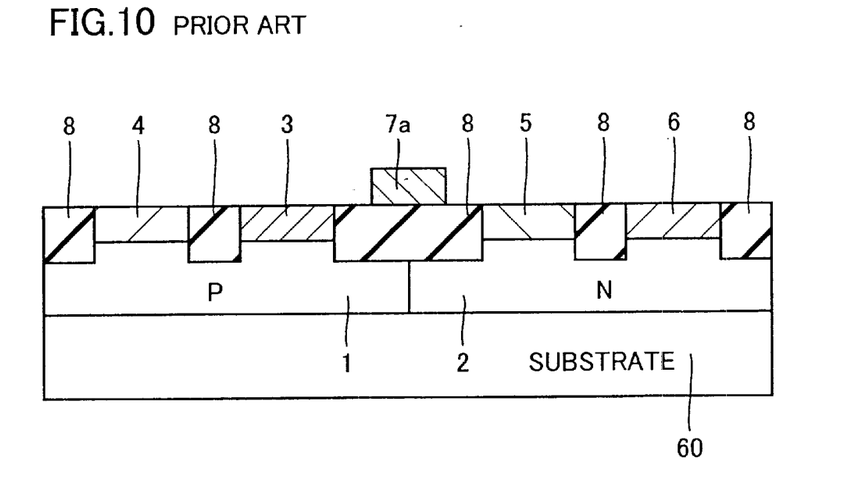
FIG. 10 is a cross sectional view along line X—X in FIG. 9.
Figure 11:
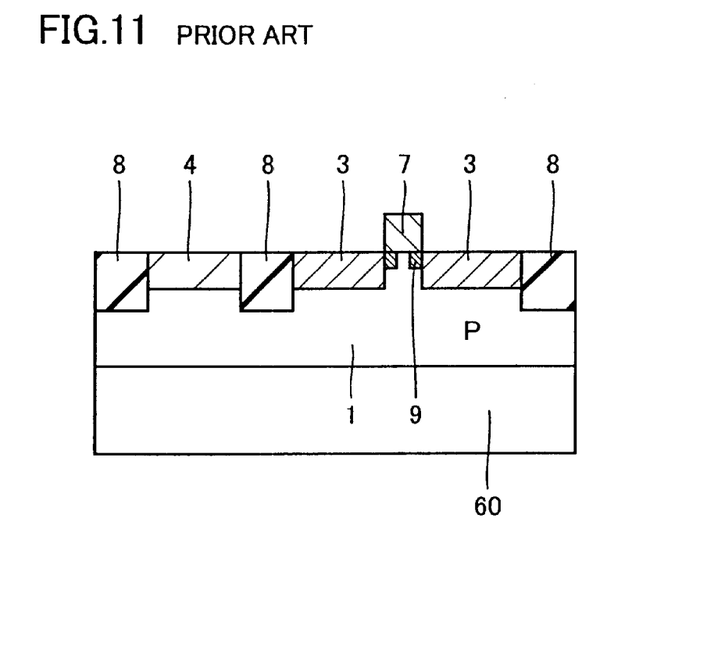
FIG. 11 is a cross sectional view along line XI—XI in FIG. 9.

FIGS. 9 to 11 schematically show a layout of an actual LSI (Large Scale Integrated circuit) such as, for example, an inverter. Here, this is an example of a theoretically implemented case and such a structure can not be gained according to a prior art as described below.

Figure 12:
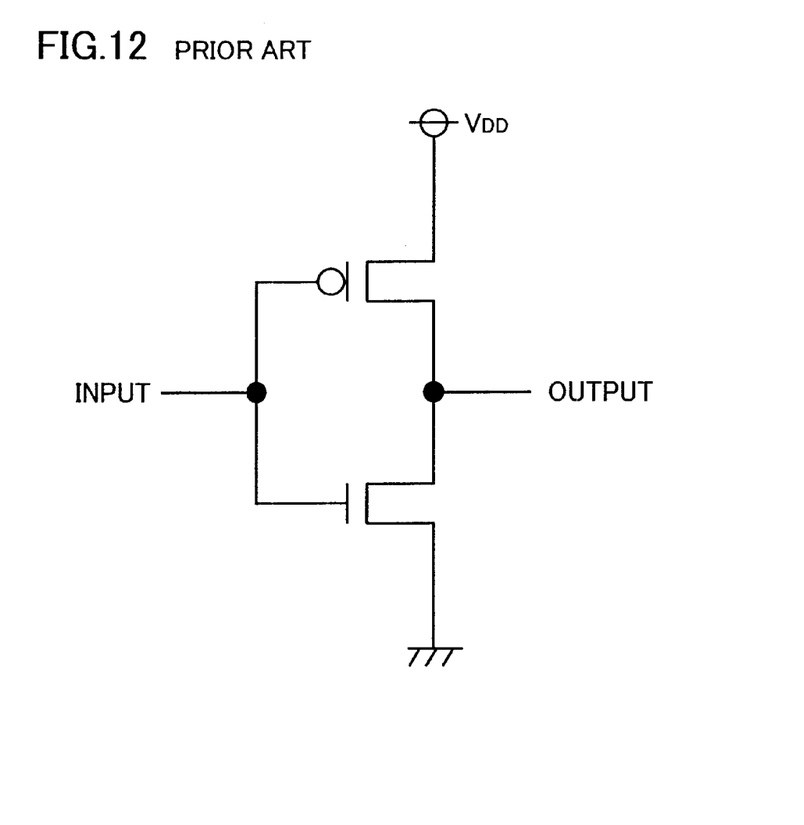
FIG. 12 is an equivalent circuit diagram of an inverter shown in FIG. 9.

FIG. 9 is a plan view and FIG. 10 is a cross sectional view along line X—X in FIG. 9. FIG. 11 is a cross sectional view along line XI—XI in FIG. 9. FIG. 12 is an equivalent circuit diagram of this inverter circuit.

Referring to these figures, a P type well region 1 that forms an NMOSFET (N-channel Metal Oxide Semiconductor Field Effect Transistor) and an N type well region 2 that forms a PMOSFET (P-channel Metal Oxide Semiconductor Field Effect Transistor) are formed in the surface of a semiconductor substrate 60. A trench isolation region 8 is formed in the surface of semiconductor substrate 60. Source/drain regions 3 that are N type diffusion regions are formed in P type well region 1. A well contact region 4 that is a P type diffusion region is formed in P type well region 1 in order to make an electrical contact 32 with P type well region 1. A swelling portion 7a in the center portion of a gate electrode 7 is formed so as to become swollen in order to easily make an electrical contact. Source/drain regions 5 that are P type diffusion regions of a PMOS (P-channel Metal Oxide Semiconductor) transistor are formed in N type well region 2. Furthermore, an N type diffusion region 6 for making an electrical contact 33 with the N type well region is formed in N type well region 2. An N-diffusion layer 9 that is formed by using diagonal implantation is provided beneath gate electrode 7 and this forms extension parts of an LDD transistor.

Figure 13:
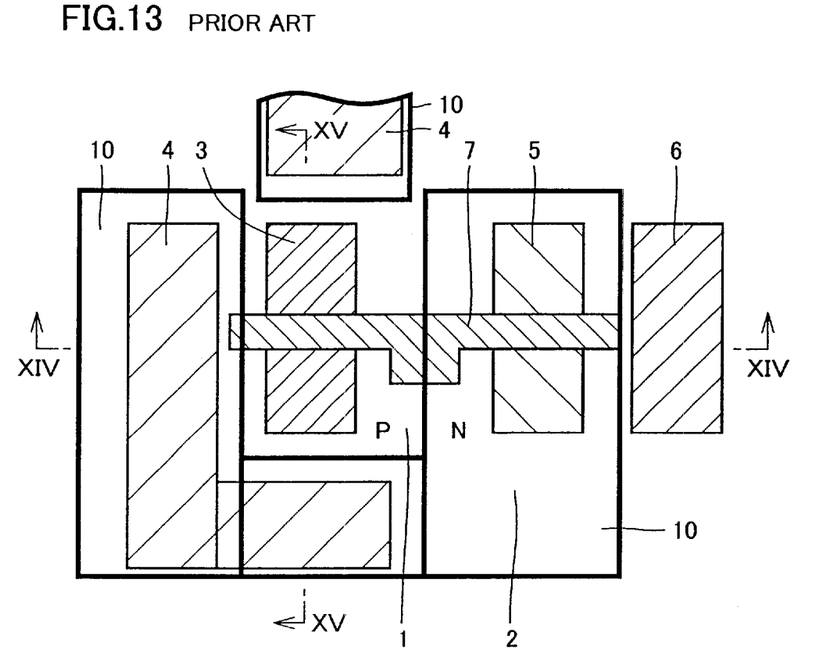
FIG. 13 is a plan view of a major step of a manufacturing method for a semiconductor device according to a prior art.
Figure 14:
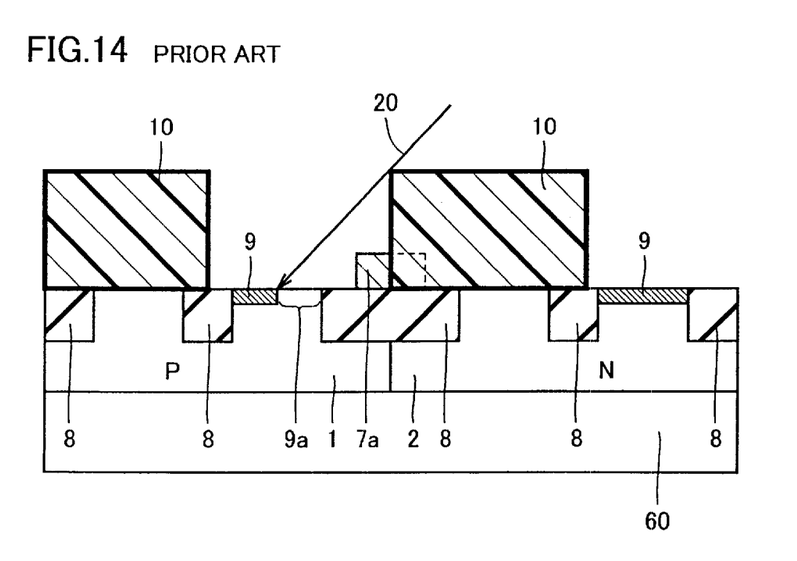
FIG. 14 is a cross sectional view along line XIV—XIV in FIG. 13.
Figure 15:
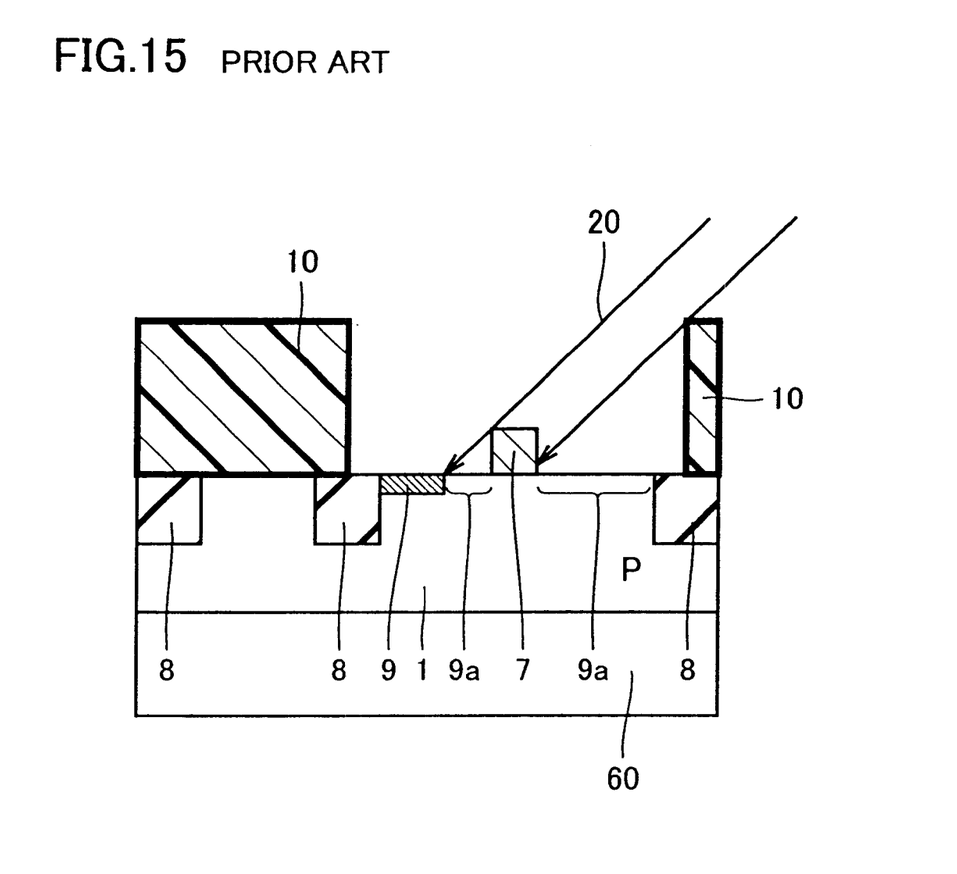
FIG 15. is a cross sectional view along line XV—XV in FIG. 13.

FIGS. 13 to 15 are views showing the steps of forming, for example, N-diffusion layer 9 beneath the gate by using diagonal implantation in the above described structural layout. FIG. 13 is a plan view, FIG. 14 is a cross sectional view along line XIV—XIV in FIG. 13 and FIG. 15 is a cross sectional view along line XV—XV in FIG. 13. Here, FIG. 13 also illustrates source/drain regions 3 and 5 as well as well contact regions 4 and 6 in order to clarify the positional relationships.

Referring to these figures, regions into which ions are not implanted are covered with a resist 10. Arrow 20 schematically shows an incident path from a specific direction of a beam for implantation seeds that are diagonally implanted.

As shown in FIGS. 14 and 15, in the case that the distance between resist 10 and N type diffusion region 3 or a region indicated by reference number 6 (implantation may sometimes not be carried out, simultaneously, in the portion indicated by reference number 6) is insufficient, ions are implanted only in region 9 and a (shadowing) region of no implantation 9a occurs due to the shadow of resist 10, although this depends on the relationship between the incident angle of the beam and the height of resist 10. Such shadowing 9a depends on the distance between resist 10 and N type diffusion region 3 or the region indicated by reference number 6. Accordingly, in the case that there is dispersion of this distance, different transistors are formed according to a layout within the LSI and, as a result, the transistor characteristics become dispersed in the respective transistors.

It becomes increasingly difficult to sufficiently secure the above distance as miniaturization advances and the greater the miniaturization of the transistor, the greater the effect of shadowing becomes to the extent such that dispersion cannot be ignored.

In addition, the same problem of shadowing occurs in the case that an SPI is formed wherein the problem occurs that the short channel effects cannot be suppressed in the transistors of which the characteristics are dispersed.

SUMMARY OF THE INVENTION

This invention is provided in order to solve the above described problems and a manufacturing method for a semiconductor device that is improved so that the dispersion of the transistors can be prevented is provided.

Another purpose of this invention is to provide a manufacturing method for a semiconductor device that is improved such that the short channel effects can be suppressed regardless of dispersion due to shadowing.

In a manufacturing method for a semiconductor device according to claim 1, first, a well of a first conductive type is formed in a semiconductor substrate (first step). A gate electrode for forming a first transistor is formed on the above described well of the first conductive type (second step). A diagonal ion implantation for drain engineering is carried out in portions beneath the above described gate electrode and in a portion wherein a well contact region for making an electrical contact with the well of the first conductive type is formed in the main surface of the above described well of the first conductive type (third step). Source/drain regions of a second conductive type are formed in the main surface of the above described well of the first conductive type on both sides of the above described gate electrode (fourth step). Ions of the first conductive type are implanted into a portion in which the above described well contact region is formed so as to form a well contact region of the first conductive type (fifth step). The above described diagonal ion implantation in the above described third step and the above described ion implantation in the above described fourth step are carried out so that when the depth is plotted along the longitudinal axis and the impurity concentration is plotted along the lateral axis in the impurity profile of the above described well contact region, the impurity profile of the first conductive type that forms the above described well contact region covers the impurity profile that forms the above described impurity diffusion layer.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 4A and 4B are graphs showing the impurity profiles of a well contact diffusion layer wherein FIG. 4A is a preferable mode while FIG. 4B is a mode that is not preferable;

DESCRIPTION OF THE PREFERRED EMBODIMENTS

In the following, the embodiments of this invention are described in reference to the drawings.

First Embodiment

Figure 1:
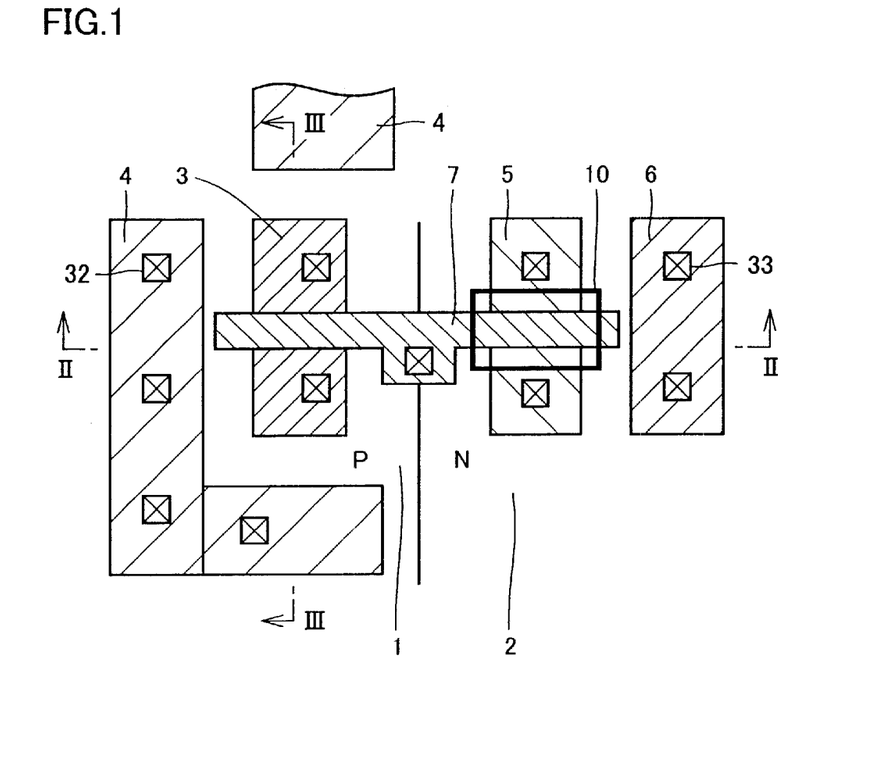
FIG. 1 is plan view of a major step of a manufacturing method for a semiconductor device according to a first embodiment.
Figure 2:
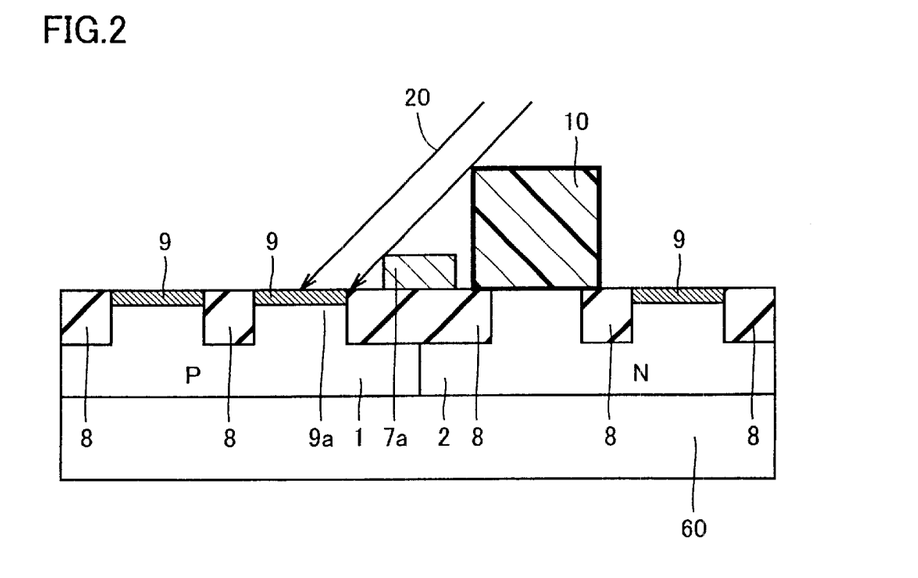
FIG. 2 is a cross sectional view along line II—II in FIG. 1 of the major step of the manufacturing method for the semiconductor device according to the first embodiment.
Figure 3:
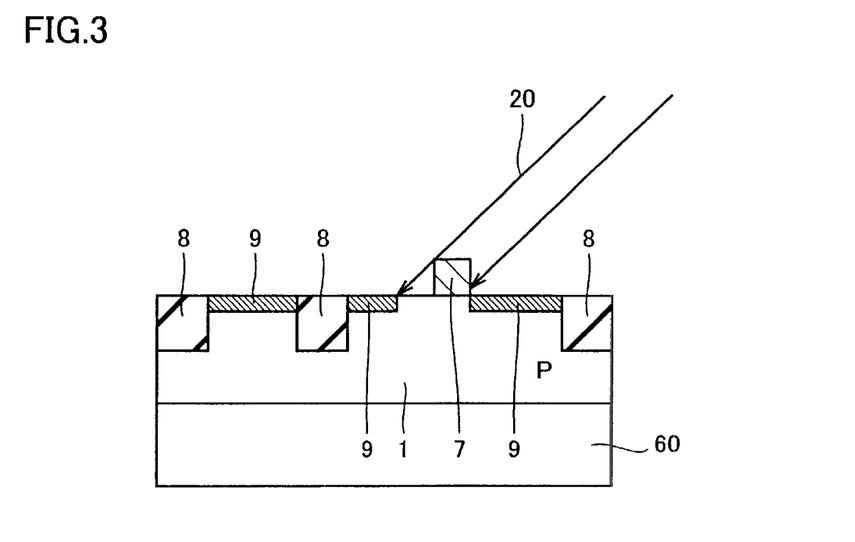
FIG. 3 is a cross sectional view along line III—III in FIG. 1 of the major step of thee manufacturing method for the semiconductor device according to the first embodiment.

FIGS. 1, 2 and 3 illustrate major steps of a manufacturing method for a semiconductor device according to a first embodiment. FIG. 1 is a plan view, FIG. 2 is a cross sectional view along line II—II in FIG. 1 and FIG. 3 is a cross sectional view along line III—III in FIG. 1. Here, FIG. 1 also illustrates source/drain regions 3 and 5 as well as well contact regions 4 and 6 that are formed in the later steps, in order to clarify the positional relationships. These figures correspond to FIGS. 13 to 15 according to a prior art.

Referring to these figures, a P type well 1 and an N type well 2 are formed in parallel in a semiconductor substrate 60. A gate electrode 7 is formed on the main surface of semiconductor substrate 60. Gate electrode 7 is formed on P type well 1 and N type well 2. An N type source/drain region e is provided in the main surface of P type well 1 on both sides of gate electrode 7. Extension parts (not shown) of an LDD transistor are formed in the main surface P type well 1 beneath gate electrode 7. A P type well contact region 4 for making an electrical contact with the P type well is formed in the main surface of P type well 1 at a position located away from gate electrode 7.

Figure 4A:
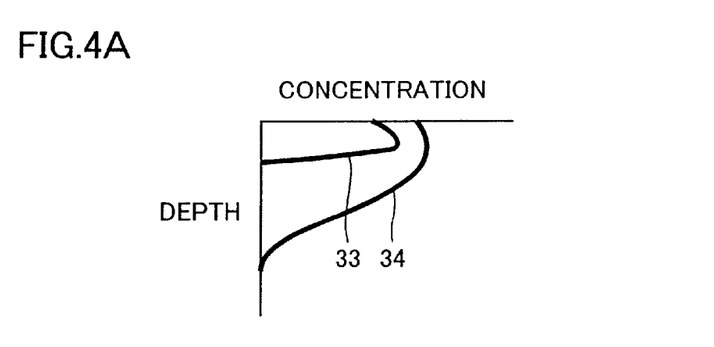

Referring to FIGS. 1 and 4A, when the depth is plotted along the longitudinal axis and the impurity concentration is plotted along the lateral axis in the impurity profile of well contact diffusion region 4, a P type impurity profile 34 that forms well contact region 4 covers a profile 33 of the impurities that form the impurity diffusion layer (extension parts of the LDD transistor) beneath the gate.

Again referring to FIG. 1, a P type source/drain region 5 is formed in the main surface of N type well 2 on both sides of gate electrode 7. An N type well contact region 6 for making an electrical contact with N type well 2 is formed in the main surface of N type well 2 at a position located away from gate electrode 7.

A P-diffusion layer (not shown) that forms extension parts of an LDD transistor is formed in the main surface of N type well 2 beneath gate electrode 7. When the depth is plotted along the longitudinal axis and the impurity concentration is plotted along the lateral axis in the impurity profile of well contact diffusion region 6, an N type impurity profile that forms well contact region 6 covers the profile of the impurities that form the impurity diffusion layer (extension parts of the LDD transistor) beneath the gate. That is to say, the NMOSFET formed in P type well region 1 and the PMOSFET formed in N type well region 2 are in a relationship of having opposite polarities, as are well contact regions 4 and 6. A trench isolation region 8 is formed in the surface of semiconductor substrate 60.

Next, a manufacturing method for such a semiconductor device is described. Referring to FIGS. 1, 2 and 3, P type well 1 is formed in semiconductor substrate 60. N type well 2 for forming a transistor of the opposite polarity adjoining P type well 1 is formed in semiconductor substrate 60. Gate electrode 7 for forming the NMOSFET is formed on P type well 1 and on N type well 2.

A region around the gate of the PMOSFET that does not, at a minimum, affect the transistor characteristics is covered with resist 10. By using resist 10 as a mask, N-type impurities are implanted in the diagonal direction 20 into a portion beneath gate electrode 7 and into a portion in which well contact region 4 for making an electrical contact with P type well 1 in the main surface of P type well 1. These N-type impurities are for forming the extension parts of the LDD transistor.

Though not illustrated, sidewall spacers are formed on the sidewalls of gate electrode 7 and N type impurities are implanted in the main surface of P type well 1 on both sides of gate electrode 7 in a self-aligning manner so that so as to form N type source/drain regions 3. After that, P type ions are implanted (not shown) into a portion in which well contact region 4 is formed so as to form P type well contact region 4.

At this time, referring to FIG. 4A, the diagonal ion implantation for forming N-diffusion layer 9 and the P type ion implantation for forming well contact region 4 are carried out by setting the conditions so that when the depth is plotted along the longitudinal axis and the impurity concentration is plotted along the lateral axis in the impurity profile of well contact diffusion region 4, P type impurity profile 34 that forms well contact region 4 covers profile 33 of the impurities that form N-diffusion layer 9. The adjustment of these profiles is carried out by controlling the angles and the energies of the ion implantations, the film thickness of the resist and the conditions of heat treatments.

Figure 4B:
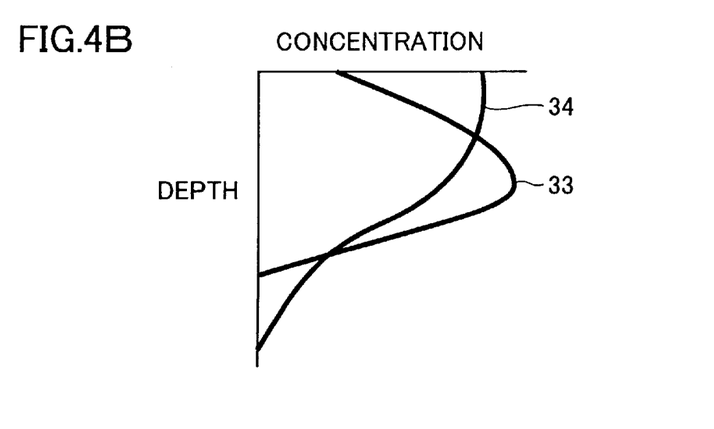

The concentration of profile 33 and the concentration of profile 34 differ by an order of one or two. At this time, as shown in FIG. 4B, it is important for profile 33 to not exceed profile 34. In the case that profile 33 exceeds profile 34, the transistor characteristics deteriorate significantly. By providing a profile structure as shown in FIG. 4A, a transistor that does not increase capacitance or leak can be formed.

In addition, according to this method only the region around the gate of the PMOS transistor that does not, at a minimum, affect the transistor characteristics is covered with a resist. That is to say, a resist is not formed on the other portions so that shadowing caused by a resist can be eliminated. Or shadowing can be limited to the minimum. As a result, dispersion of the transistors due to shadowing resulting from the layout can be controlled so that a device that is suitable for miniaturization can be provided.

As for the PMOSFET, exactly the same structure can be provided, except for the opposite polarity, by adopting the steps corresponding to the steps of fabricating the NMOSFET using the impurities for the opposite polarity.

Figure 5:
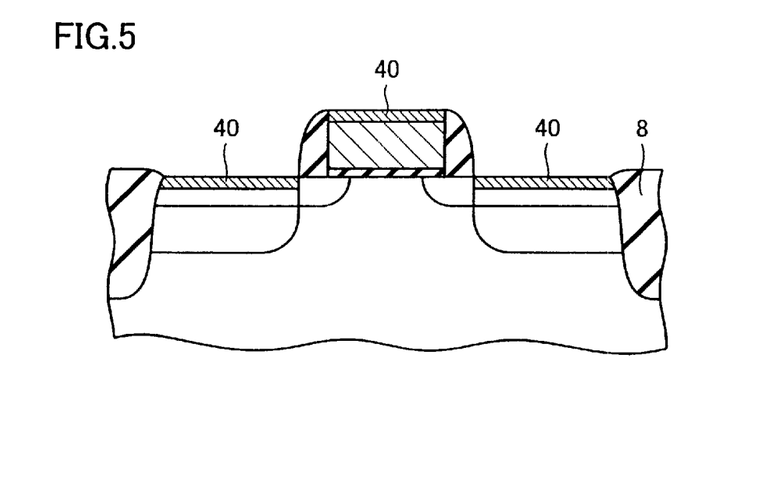
FIG. 5 is a cross sectional view of a semiconductor device that illustrates the step of forming a silicide layer on the surface of an N type source/drain layer.
Figure 6A:
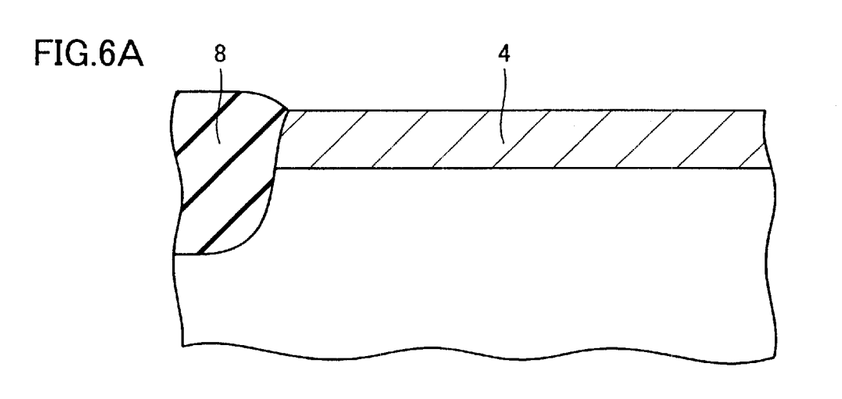
FIG. 6A is a cross sectional view of a semiconductor device that has a trench isolation and FIG. 6B is a cross sectional view of a semiconductor device that has a LOCOS (Local Oxidation of Silicon) isolation.
Figure 6B:
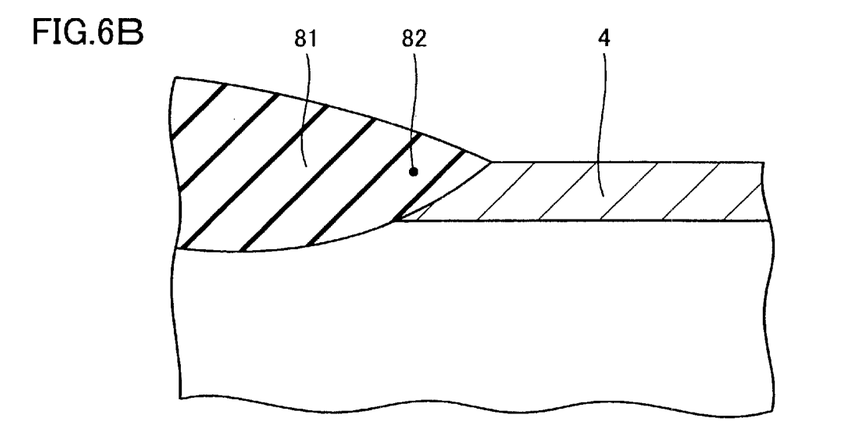

Referring to FIG. 5, a low end stable resistance can be maintained even when the impurity distribution in the source/drain regions is not uniform by forming a silicide 40 on the surface of source/drain regions 3. Here, the formation of the silicide is carried out by forming a Co or Ti layer on the source/drain regions, which is heat treated and, after that, by removing the metal layer that has not become converted to silicide. Referring to FIG. 6A, trench isolation 8 is adopted in the present invention and by adopting such a trench isolation, the profile relationship shown in FIG. 4A can be effectively maintained in well contact region 4. On the other hand, in the case that a LOCOS isolation, as shown in FIG. 6B, is adopted in the present invention, the relationship of FIG. 4A is not satisfied at a portion 82 wherein the thickness of field oxide film 81 is reduced so that the transistor characteristics may deteriorate.

Second Embodiment

Though in the first embodiment a diagonal implantation at the time when an N-diffusion layer or a P-diffusion layer is formed in a CMOSFET (Complementary Metal Oxide Semiconductor Field Effect Transistor) that has both an NMOS (N-channel Metal Oxide Semiconductor) transistor and a PMOS transistor, this invention is not limited to this. That is to say, the present invention can be applied to cases other than wherein a CMOSFET is formed, such as the case of an NMOS transistor alone that has an LDD structure or the case of a PMOS transistor alone that has an LDD structure in order to gain the same effects.

Third Embodiment

Though in the first and second embodiments a diagonal implantation for forming an N-diffusion layer or a P-diffusion layer beneath the gate electrode is described, this invention is not limited to this. That is to say, it is possible to apply the present invention to an SPI structure that extends beneath the gate as shown in FIG. 8B. That is to say, it is possible to apply the present invention to the case wherein in FIG. 2 ions that are of the opposite conductive type (P type) to the ions for forming N type source/drain regions 3 are diagonally implanted in place of the ion implantation for forming N-diffusion layer 9 so that a punch through stopper layer is formed. Thereby, a transistor is gained wherein the HC (hot carrier) tolerance is increased and the short channel effect is suppressed.

In addition, in the case that the impurity diffusion layer beneath the gate includes extension parts and a punch through stopper layer of an LDD (lightly doped drain) transistor, the working effects of both of them are exercised in the same manner so as to gain the same effects.

The embodiments disclosed herein should be considered as illustrative from all points of view and are not limitative. The scope of the present invention is defined not by the above description but, rather, by claims and is intended to include the meaning equivalent to the claims and all modifications within the scope.

As described above, according to this invention a device can be provided wherein the dispersion of the transistors due to shadowing resulting from the layout can be controlled and which is suitable for miniaturization.

In addition, according to this invention, a transistor of which the HC (hot carrier) tolerance is increased and wherein the short channel effect is suppressed can be gained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A manufacturing method for a semiconductor device, comprising:

the first step of forming a well of a first conductive type in a semiconductor substrate;

the second step of forming a gate electrode for forming a first transistor on said well of the first conductive type;

the third step of diagonally implanting ions into a portion beneath said gate electrode and into a portion in which a well contact region for making an electrical contact with the well of the first conductive type is formed in the main surface of said well of the first conductive type;

the fourth step of forming source/drain regions of a second conductive type in the main surface of said well of the first conductive type on both sides of said gate electrode; and the fifth step of forming the well contact region of the first conductive type by implanting ions of the first conductive type into the portion for forming said well contact region, wherein said diagonal ion implantation in said third step and said ion implantation in said fourth step are carried out so that when the depth is plotted along the longitudinal axis and the impurity concentration is plotted along the lateral axis in the impurity profile of said well contact region, the impurity profile of the first conductive type that forms said well contact region covers the profile of the impurities that form said impurity diffusion layer beneath the gate.

2. The manufacturing method for a semiconductor device according to claim 1, wherein a well of the second conductive type for forming a second transistor of the opposite polarity to said first transistor is formed in said semiconductor substrate adjoining the well of the first conductive type, wherein said gate electrode is formed for forming the first and second transistors, and wherein a region around the gate of said second transistor that does not, at a minimum, affect the transistor characteristics is covered with a resist before said diagonal ion implantation is carried out.

3. The manufacturing method for a semiconductor device according to claim 1, further comprising the step of forming a silicide layer on the surface of said source/drain regions.

4. The manufacturing method for a semiconductor device according to claim 1, further comprising the step of forming a trench isolation in the surface of said semiconductor substrate prior to the formation of said well of the first conductive type.

* * * * *